United States Patent
Hwang et al.

(10) Patent No.: US 9,857,661 B2
(45) Date of Patent: Jan. 2, 2018

(54) PHOTONIC MICROWAVE GENERATION APPARATUS AND METHOD THEREOF

(71) Applicant: NATIONAL CHENG KUNG UNIVERSITY, Tainan (TW)

(72) Inventors: Sheng-Kwang Hwang, Tainan (TW); Yu-Han Hung, Chiayi (TW)

(73) Assignee: National Cheng Kung University, Tainan (TW)

( * ) Notice: Subject to any disclaimer, the term of this patent is extended or adjusted under 35 U.S.C. 154(b) by 0 days.

(21) Appl. No.: 15/056,042

(22) Filed: Feb. 29, 2016

(65) Prior Publication Data

US 2017/0059962 A1  Mar. 2, 2017

(30) Foreign Application Priority Data

Aug. 27, 2015 (TW) ............................. 104128039 A

(51) Int. Cl.
| | |
|---|---|
| G02F 1/35 | (2006.01) |
| G02B 6/27 | (2006.01) |
| H01S 5/062 | (2006.01) |

(52) U.S. Cl.
CPC ........... *G02F 1/353* (2013.01); *G02B 6/2746* (2013.01); *H01S 5/06236* (2013.01)

(58) Field of Classification Search
CPC .................................. G02F 1/35; G02F 1/353
See application file for complete search history.

(56) References Cited

U.S. PATENT DOCUMENTS

| | | | | |
|---|---|---|---|---|
| 5,016,242 A | * | 5/1991 | Tang | H04J 14/0298 398/76 |
| 6,008,931 A | * | 12/1999 | von Helmolt | G01J 9/02 359/326 |
| 7,142,570 B2 | * | 11/2006 | Lee | G02F 2/002 356/484 |
| 9,473,247 B2 | * | 10/2016 | Hwang | H04B 10/5165 |
| 2013/0212751 A1 | * | 8/2013 | Hagmann | B82Y 35/00 850/26 |

FOREIGN PATENT DOCUMENTS

CN  101794964 A  *  8/2010  ............... H01S 3/30

* cited by examiner

*Primary Examiner* — Daniel Petkovsek
(74) *Attorney, Agent, or Firm* — Muncy, Geissler, Olds & Lowe, P.C.

(57) ABSTRACT

A photonic microwave generation apparatus and a method thereof are disclosed. A comb-like optical signal generation module of the photonic microwave generation apparatus generates a comb-like optical signal. The comb-like optical signal is injected into a photonic microwave generation module of the photonic microwave generation apparatus, wherein the photonic microwave generation module includes a microwave generation laser. An optical power and a carrier frequency of the comb-like optical signal are adjusted so as to place the microwave generation laser in period-one nonlinear dynamics, and, at the same time, to phase-lock an oscillation sideband of the period-one nonlinear dynamics by one harmonic of the comb-like optical signal. Under such operation, the microwave generation laser emits an output optical signal that carries a microwave signal of a narrow linewidth and a stable frequency, which can be retrieved from the output optical signal by using a photodetector.

11 Claims, 12 Drawing Sheets

PHOTONIC MICROWAVE GENERATION APPARATUS AND METHOD THEREOF

CROSS-REFERENCE TO RELATED APPLICATION

This application claims priority from Taiwan Patent Application No. 104128039, filed on Aug. 27, 2015 in Taiwan Intellectual Property Office, the contents of which are hereby incorporated by reference in their entirety.

BACKGROUND OF THE INVENTION

1. Field of the Invention

The present invention relates to a photonic microwave generation apparatus and method thereof by using, particularly, period-one nonlinear dynamics of semiconductor lasers.

2. Description of the Related Art

Due to the continuously increasing demand for transmission of massive data and high-definition videos, a considerable enhancement in the capacity of a communication system has become urgently important. For current wireless communication systems, the operating frequencies of the microwave carriers are mostly below 6 GHz, which limits the enhancement of the communication bandwidth and therefore restricts the capability of the current systems to support the continuously increasing requirement of communication capacity. If the frequencies of the microwave carriers can be significantly increased, the communication bandwidths and therefore the communication capacity provided by the wireless communication systems can be substantially improved.

Hence, telecommunication operators and manufacturers have proposed to adopt high-frequency microwave signals as carriers for the next-generation wireless communication systems (For example, Samsung and Nokia have proposed to use 28 and 70 GHz, respectively) in order to provide a communication bandwidth of 100 or even 1000 times more than that of the current systems. On the other hand, they have also proposed to adopt an architecture for the next-generation wireless access networks, which combines the wireless and fiber-optic communication systems, to enjoy the advantages both systems provide. In this manner, not only a considerably broader communication bandwidth is provided, but also a significantly wider communication coverage is feasible. Compared with the current wireless network architecture, more than 80% of signal processing functionalities will be moved from the remote base stations to the central offices in the next-generation network architecture. The most important signal processing functionalities include (1) the generation of high-frequency microwave signals and (2) the superposition of such microwave signals onto optical carriers for fiber distribution to remote base stations. As opposed to electronic microwave generation apparatuses that require two different steps to complete the aforementioned microwave generation and superposition, photonic microwave generation apparatuses need only one step based on an approximately all-optical approach to generate optically carried high-frequency microwave signals. In this manner, not only expensive electronic devices and equipment are much less needed, but also the limitation in generating high-frequency microwave signals due to the electronic bandwidth restriction can be mitigated.

Three commonly adopted photonic microwave generation apparatuses and methods for the generation of high-frequency microwave signals are briefly described as follows.

(1) Optical Heterodyning:

This is an all-optical method without the need of any electronic devices, which uses interference between two continuous-wave optical signals of different optical frequencies at a photodetector. The frequency of the generated microwave signals is broadly tunable up to the order of 1 or even 10 THz. However, since the two optical signals are generally not phase correlated to each other, the frequency of the generated microwave signals jitters significantly and the linewidth of the generated microwave signals is considerably broad, which are disadvantageous for practical applications. Therefore, an approach using an optical phase-locked loop is generally needed for this photonic microwave generation method to solve these two problems. However, the optical phase-locked loop itself is a very complicated electronic circuit requiring many high-frequency electronic components, which offsets the initial advantages this photonic microwave generation method provides.

(2) Optoelectronic Oscillator:

This method sends in a continuous-wave optical signal into an optoelectronic loop, which consists of an optical modulator, an optical delay line, a photodetector, a microwave amplifier, and a narrow bandpass filter, for the generation of high-frequency microwave signals. Even though the frequency of the generated microwave signals can be up to 75 GHz, the range of the tuning is limited. The advantages of this method include that the generated high-frequency microwave signals are extremely stable in their frequency and narrow in their linewidth, and that no electronic microwave signal generator is necessary. However, the disadvantages of this method include that many high-frequency electronic and photonic devices are required, and that the tuning range of the microwave frequency is restricted which limits the extent of the re-configurability of the method for different frequency requirements.

(3) Mode-Locked Semiconductor Laser

This method utilizes the interference between the longitudinal modes of a mode-locked semiconductor laser at a photodetector. Even though the system configuration is relatively simple, this method needs a very expensive and complex mode-locked semiconductor laser. In addition, the frequency of the generated microwave signals is only up to about 50 GHz and cannot be adjusted or tuned once the laser is given. The advantage of this method is that the generated microwave signals are stable in their frequency and narrow in their linewidth. However, the disadvantage of this method is that the microwave frequency cannot be tuned, which provide the method with no re-configurability for different frequency requirements.

SUMMARY OF THE INVENTION

According to the problems and challenges encountered in prior arts, the purpose of the present invention is to provide an apparatus and a method for high-frequency microwave generation based on period-one nonlinear dynamics of a semiconductor laser. Only a typical and commercially available semiconductor laser is required as the key component, which could be a Fabry Perot laser, a distributed feedback laser, a vertical cavity surface emitting laser, a quantum-well laser, a quantum-dash laser, or a quantum-dot laser. No specific or high-speed semiconductor laser is necessary. Together with a comb-like optical signal generation module, high-frequency microwave signals can be generated using the period-one nonlinear dynamics of the semiconductor laser without the need of complicated electronic circuits and high-frequency electronic or photonic components. The method of the present invention is to inject a comb-like optical signal from the comb-like optical signal generation module into the semiconductor laser under a proper injection frequency and a proper injection power so that the semiconductor laser is operated at the period-one nonlinear dynamics and, as a result, emits an output optical signal carrying a microwave signal of a narrow linewidth and a stable frequency. Since the frequency of the generated microwave signal can be continuously tuned over a broad range, the microwave signal of the apparatus can be dynamically reconfigured for different communication networks requiring different operating microwave frequencies. In addition, owing to the narrow linewidth and low phase noise of the generated microwave signal, it is beneficial for the next generation wireless systems to adopt advanced modulation formats for data transmission in order to further increase the communication capacity. Since the optical modulation depth of the output optical signal is close to 100% when the semiconductor laser is operated at the period-one dynamics, the power of the generated microwave signal is maximized under the same power level of the output optical signal, which is advantageous in improving the detection sensitivity, fiber transmission distance, and the link gain of a communication network. Moreover, since the output optical signal exhibits an optical single-sideband modulation feature, in which the power of one modulation sideband is much higher than that of the other, the microwave power fading effect due to fiber chromatic dispersion can be mitigated when such an optical signal is distributed over fibers.

According to the aforementioned purposes, the present invention provides a photonic microwave generation apparatus which includes a comb-like optical signal generation module and a photonic microwave generation module. The comb-like optical signal generation module generates a comb-like optical signal. The photonic microwave generation module comprises a microwave generation laser and receives the comb-like optical signal to generate an output optical signal carrying a microwave signal of a narrow linewidth and a stable frequency. The optical power and carrier frequency of the comb-like optical signal are adjusted so as to place the microwave generation laser in the period-one nonlinear dynamics and, at the same time, one harmonic of the comb-like optical signal phase-locks one oscillation sideband of the period-one nonlinear dynamics.

Preferably, the comb-like optical signal generation module may include an optical injection laser generating a continuous-wave optical signal, and an optical polarization controller adjusting the polarization of the continuous-wave optical signal. In addition, the comb-like optical signal generation module may further comprise a microwave reference generator generating a microwave reference, and a microwave amplifier receiving the microwave reference and generating a comb-like microwave signal by using the nonlinearity of the microwave amplifier. Wherein, the comb-like microwave signal is a microwave signal of multiple harmonics with highly correlated phases. The comb-like optical signal generation module may also include an external modulator superimposing the comb-like microwave signal on the continuous-wave optical signal in order to generate the comb-like optical signal, wherein the comb-like optical signal is an optical signal of multiple harmonics with highly correlated phases.

Preferably, the photonic microwave generation module may further comprise an optical power adjuster adjusting the optical power of the comb-like optical signal, and an optical polarization controller adjusting the polarization of the comb-like optical signal and outputting the comb-like optical signal to the microwave generation laser.

Preferably, the optical power adjuster may include an active optical device or a passive optical device. The active optical device may be an optical power amplifier and the passive optical device may be an optical power attenuator.

Preferably, the photonic microwave generation module may further comprise an optical path controller, disposed at an input end of the microwave generation laser, unidirectionally directing the comb-like optical signal toward the microwave generation laser, and unidirectionally directing the output optical signal of the microwave generation laser toward an output port of the photonic microwave generation apparatus.

Preferably, the optical path controller may be an optical circulator. The microwave generation laser may be a semiconductor laser.

Besides, according to the aforementioned purposes, the present invention further provides a photonic microwave generation method which includes the following steps:

(1) using a comb-like optical signal generation module to generate a comb-like optical signal, and (2) using a photonic microwave generation module comprising a microwave generation laser to receive the comb-like optical signal and to generate an output optical signal carrying a microwave signal of a narrow linewidth and a stable frequency, wherein the optical power and carrier frequency of the comb-like optical signal are adjusted so as to place the microwave generation laser in period-one nonlinear dynamics and, at the same time, one harmonic of the comb-like optical signal phase-locks one oscillation sideband of the period-one nonlinear dynamics.

Preferably, the using the comb-like optical signal generation module to generate the comb-like optical signal may comprise steps of:

(1) using an optical injection laser to generate a continuous-wave optical signal, (2) using an optical polarization controller to adjust the polarization of the continuous-wave optical signal, (3) using a microwave reference generator to generate a microwave reference, (4) using a microwave amplifier to receive the microwave reference and to generate a comb-like microwave signal by using the nonlinearity of the microwave amplifier, wherein the comb-like microwave signal is a microwave signal of multiple harmonics with highly correlated phases, and (5) using an external modulator to superimpose the comb-like microwave signal on the continuous-wave optical signal to generate the comb-like optical signal, wherein the comb-like optical signal is an optical signal of multiple harmonics with highly correlated phases.

Preferably, two more steps may be also included between the using the comb-like optical signal generation module to generate the comb-like optical signal and the using the photonic microwave generation module to receive the comb-like optical signal and to generate the output optical signal:

(1) using an optical power adjuster to adjust the optical power of the comb-like optical signal, and (2) using an optical polarization controller to adjust the polarization of the comb-like optical signal and output the comb-like optical signal to the microwave generation laser.

Furthermore, the using the photonic microwave generation module to receive the comb-like optical signal and to generate the output optical signal may further comprise: using an optical path controller to unidirectionally direct the comb-like optical signal toward the microwave generation laser, and to unidirectionally direct the output optical signal of the microwave generation laser toward an output port of the photonic microwave generation apparatus.

Accordingly, the photonic microwave generation apparatus and method based upon the present invention possess one or more of the following characteristics and advantages:

(1) The frequencies of the microwave signals generated by the present invention are highly stable and continuously tunable over a broad range. This characteristic makes the present invention easy to be dynamically reconfigured for different communication networks requiring different operating microwave frequencies.

(2) The linewidths of the microwave signals generated by the present invention are narrow, while the phase noises of the microwave signals are low. These characteristics make the present invention beneficial for the next generation wireless communication systems to adopt advanced modulation formats for data transmission in order to further increase the communication capacity, or for other technological applications using the phase or frequency of a microwave signal for certain functionalities.

(3) The optical modulation depth of the output optical signals generated by the present invention is close to 100%. Therefore, the power of the microwave signals carried by the output optical signals is maximized under a fixed output optical power level. This characteristic is advantageous in improving the detection sensitivity, fiber transmission distance, and the link gain of a communication network, or is beneficial for other technological applications requiring high microwave power.

(4) The output optical signals generated by the present invention exhibit an optical single-sideband modulation feature, in which the power of one modulation sideband is much higher than that of the other. This characteristic mitigates the microwave power fading effect due to fiber chromatic dispersion when such optical signals are distributed over fibers.

(5) The photonic microwave generation apparatus of the present invention only requires a typical and commercially available semiconductor laser as the key component, which could be a Fabry Perot laser, a distributed feedback laser, a vertical cavity surface emitting laser, a quantum-well laser, a quantum-dash laser, or a quantum-dot laser. No specific or high-speed semiconductor laser is necessary. Together with a comb-like optical signal generation module which consist of a low-frequency electronic microwave generator, a microwave amplifier, and an optical modulator, high-frequency microwave signals can be generated using period-one nonlinear dynamics of a semiconductor laser without the need of complicated electronic circuits and high-frequency electronic or photonic components.

The aforementioned purposes, characteristics, and advantages of the present invention are more fully described with preferred embodiments and drawings as follows.

BRIEF DESCRIPTION OF THE DRAWINGS

The device structure, operating principle, and advantageous characteristics of the present invention are described with more details hereinafter with reference to the accompanying drawings that show various embodiments of the present invention as follows.

DETAILED DESCRIPTION OF THE PREFERRED EMBODIMENTS

To illustrate the device structure, operating principle, and advantageous characteristics of the present invention, a preferred embodiment and the corresponding drawings are provided with more details. The purpose of the drawings being used is for illustration, and they are not necessarily the real proportion and precise allocation of the embodiments of the present invention. Therefore, they should not be used to limit the privilege coverage of the practical embodiments of the present invention.

Figure 1:
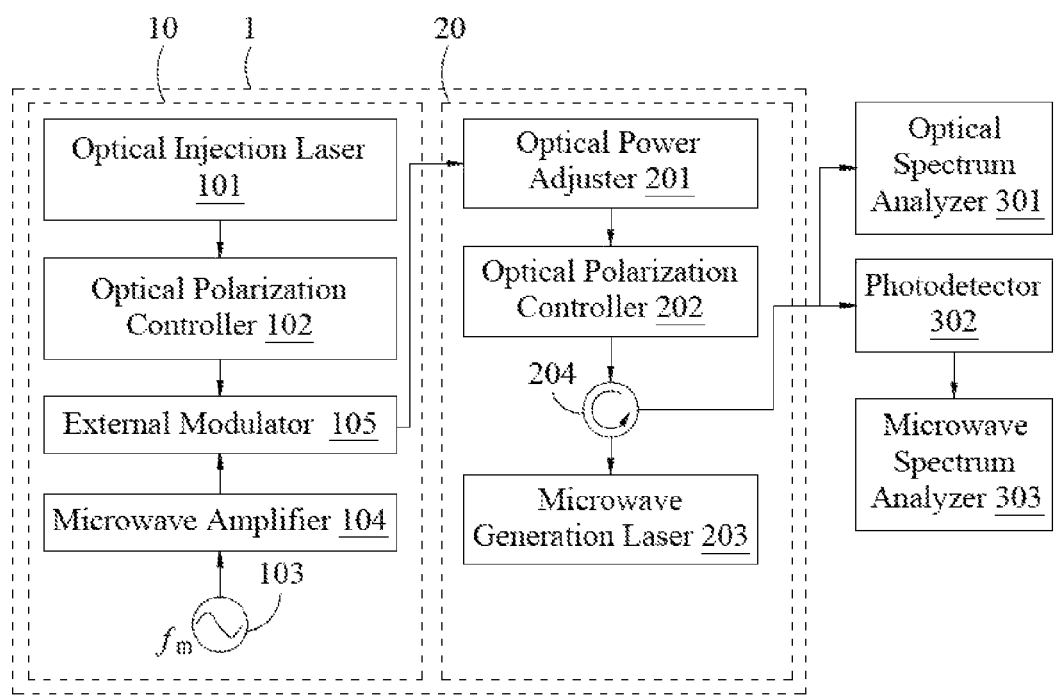
FIG. 1 is a schematic representation of a photonic microwave generation apparatus according to a preferred embodiment of the present invention.
Figure 2:
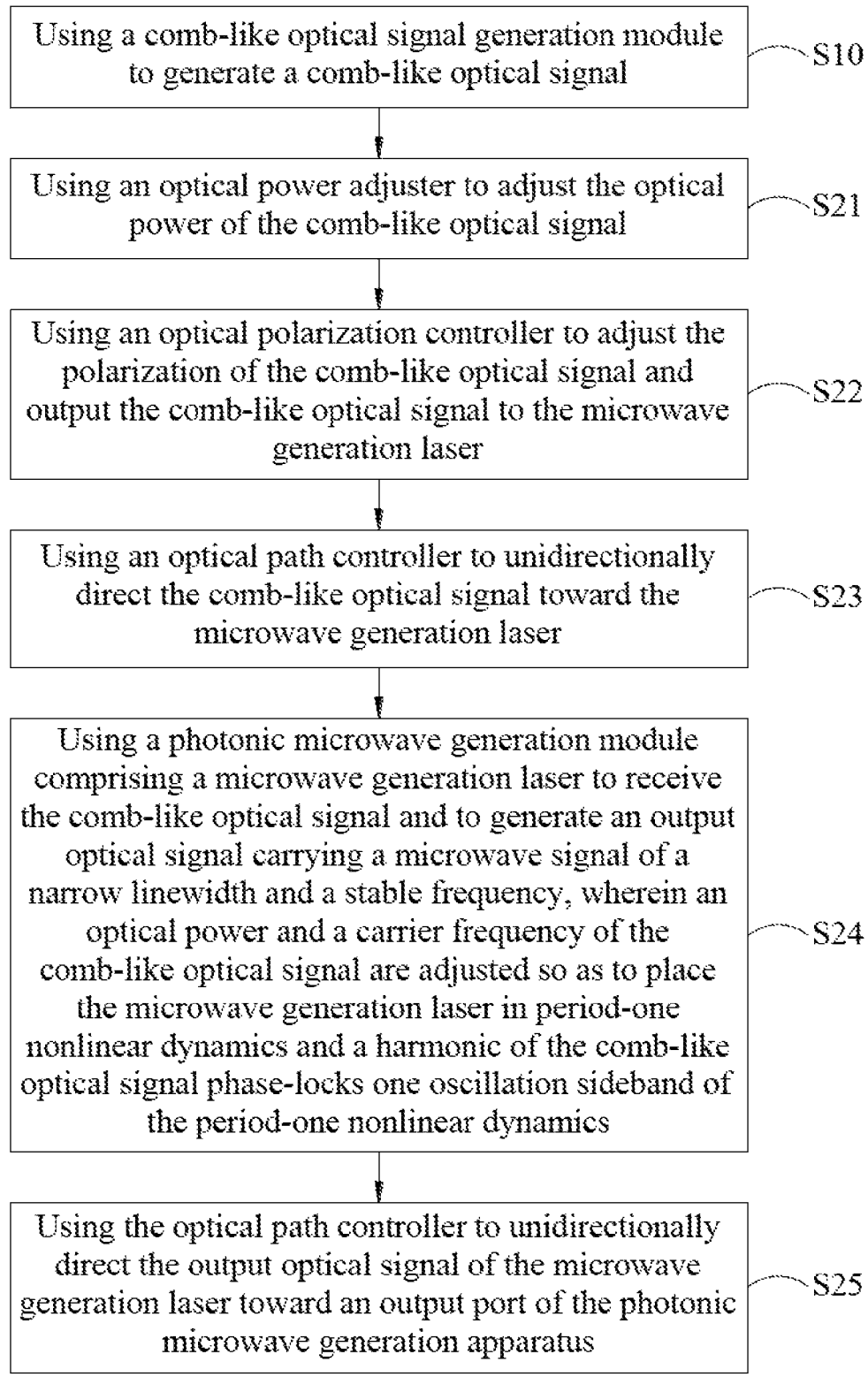
FIG. 2 is a first flow diagram showing a photonic microwave generation method according to the preferred embodiment of the present invention.

Referring to FIG. 1, FIG. 1 is a schematic representation of a photonic microwave generation apparatus according to a preferred embodiment of the present invention. As shown in FIG. 1, a photonic microwave generation apparatus 1 includes a comb-like optical signal generation module 10 and a photonic microwave generation module 20. The comb-like optical signal generation module 10 generates a comb-like optical signal, and the photonic microwave generation module 20 receives the comb-like optical signal from the comb-like optical signal generation module 10. The photonic microwave generation module 20 includes a microwave generation laser 203. The optical power and carrier frequency of the comb-like optical signal received by the photonic microwave generation module 20 are adjusted so as to place the microwave generation laser 203 in period-one nonlinear dynamics. Meanwhile, one harmonic of the comb-like optical signal phase-locks one oscillation sideband of the period-one nonlinear dynamics. As a result, the microwave generation laser 203 generates an output optical signal carrying a microwave signal of a narrow linewidth and a stable frequency.

Figure 4:
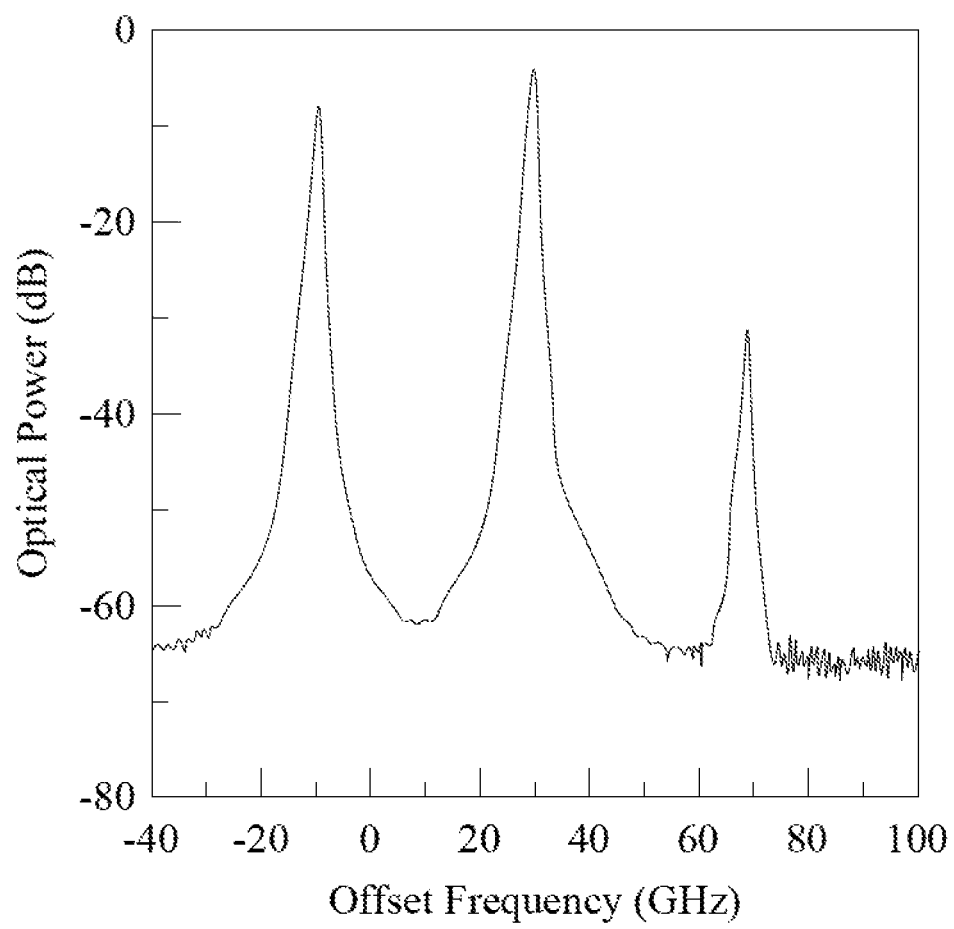
FIG. 4 shows an optical spectrum of a period-one non-linear dynamical state when a microwave generation laser is subject to continuous-wave optical injection according to the preferred embodiment of the present invention. The x-axis is relative to the free-running frequency of the microwave generation laser.
Figure 5:
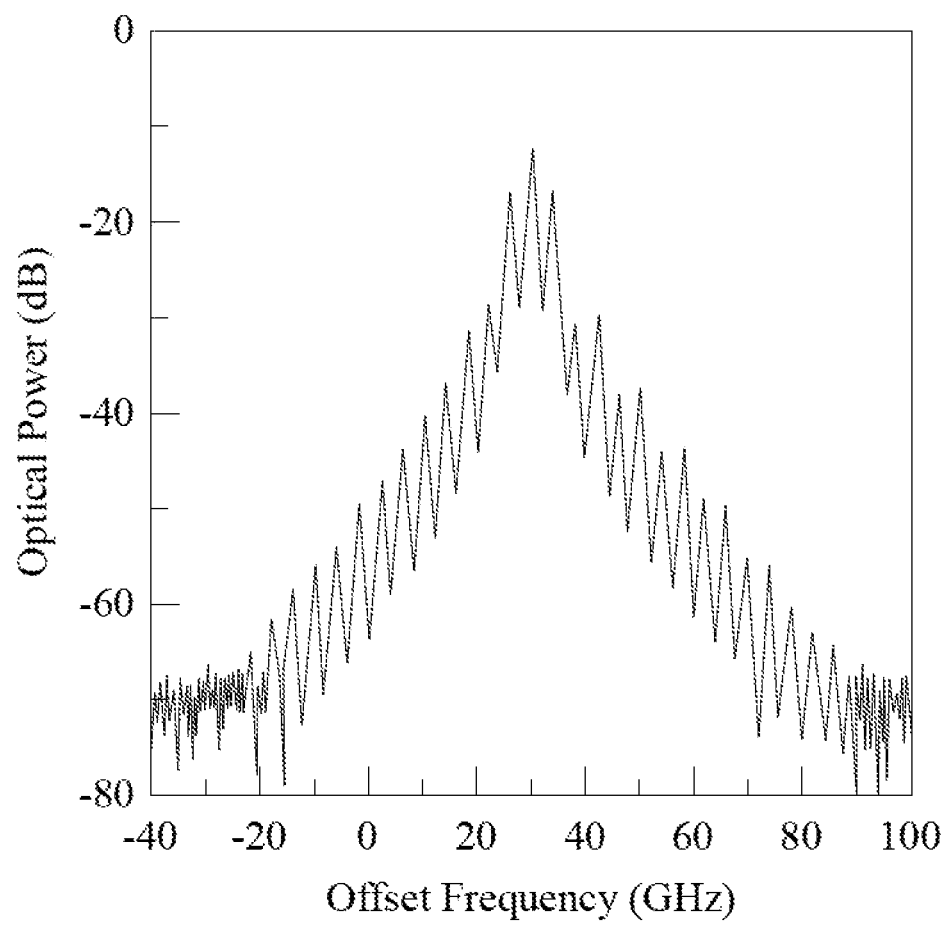
FIG. 5 shows an optical spectrum of a comb-like optical signal generated by a comb-like optical signal generation module according to the preferred embodiment of the present invention. The x-axis is relative to the free-running frequency of the microwave generation laser.
Figure 6:
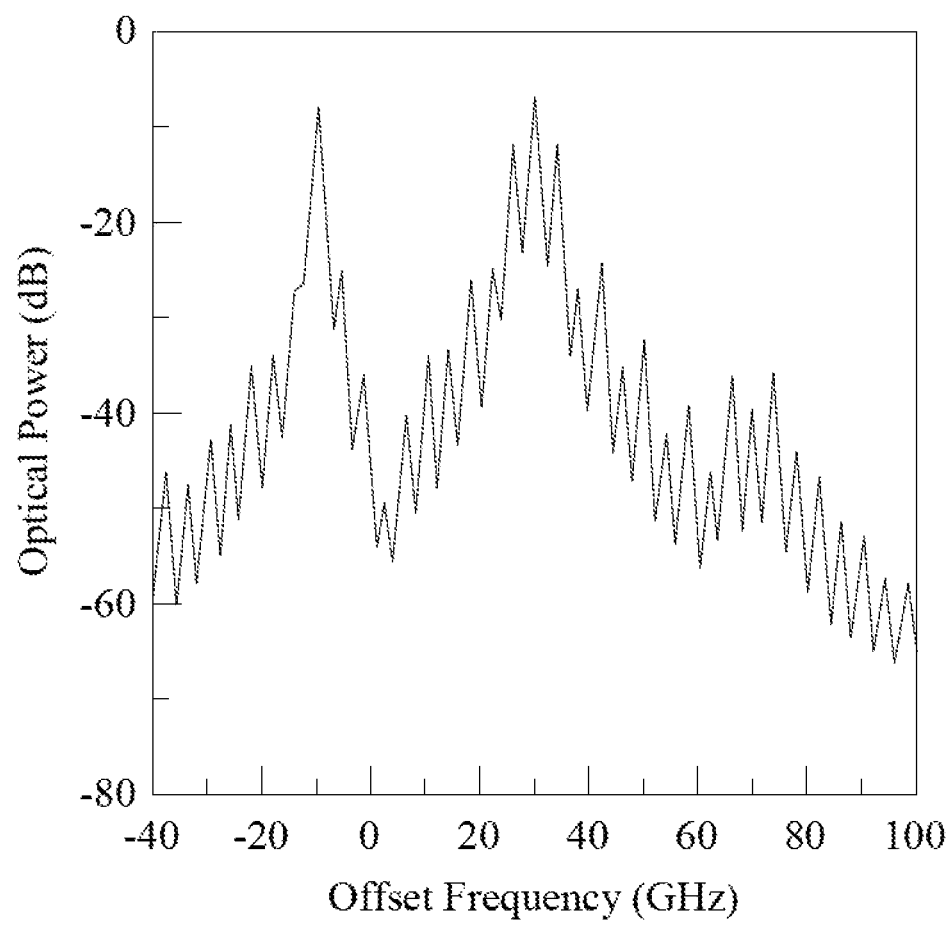
FIG. 6 shows an optical spectrum of an output optical signal when the microwave generation laser is subject to the injection of the comb-like optical signal according to the preferred embodiment of the present invention. The x-axis is relative to the free-running frequency of the microwave generation laser.
Figure 7:
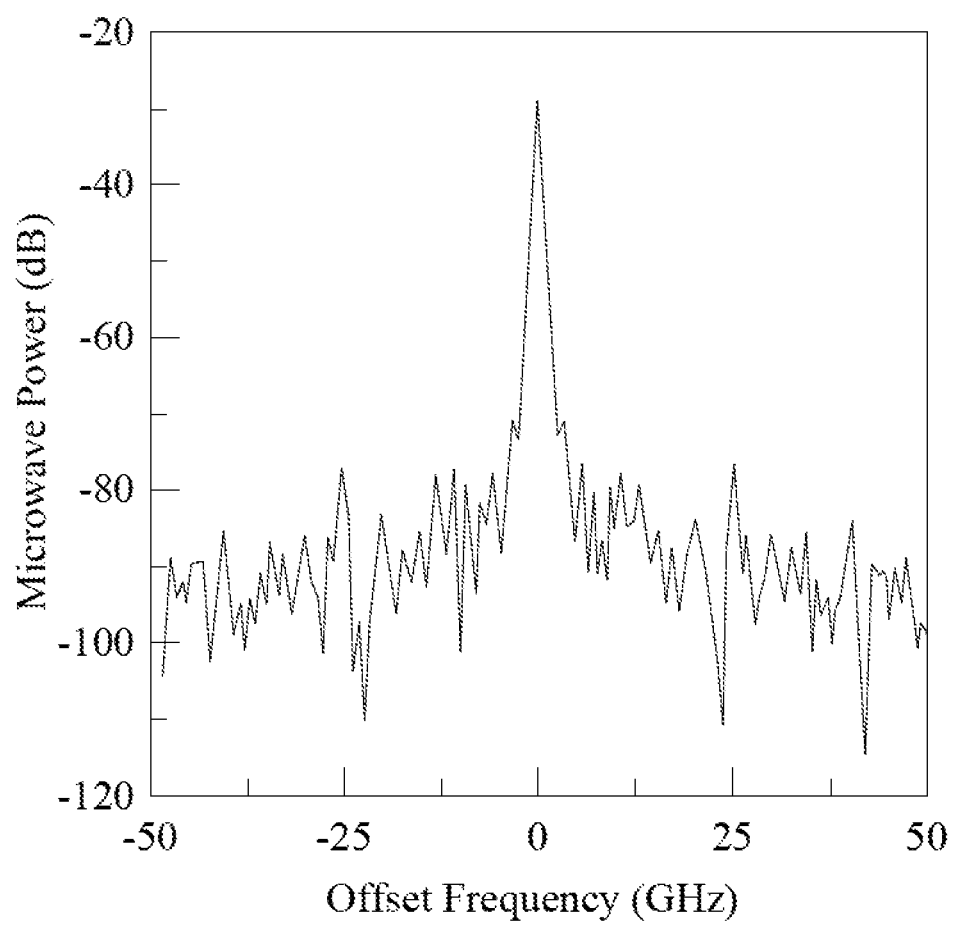
FIG. 7 shows a microwave spectrum, centering at 40 GHz, of the output optical signal when the microwave generation laser is subject to the injection of the comb-like optical signal according to the preferred embodiment of the present invention.

Referring to FIG. 1 and FIG. 4 to FIG. 7, FIG. 4 shows an optical spectrum of a period-one nonlinear dynamical state when the microwave generation laser 203 is subject to continuous-wave optical injection according to the preferred embodiment of the present invention, FIG. 5 shows an optical spectrum of the comb-like optical signal generated by the comb-like optical signal generation module 10 according to the preferred embodiment of the present invention, FIG. 6 shows an optical spectrum of the output optical signal when the microwave generation laser 203 is subject to the injection of the comb-like optical signal according to the preferred embodiment of the present invention, and FIG. 7 shows a microwave spectrum of the output optical signal when the microwave generation laser 203 is subject to the injection of the comb-like optical signal according to the preferred embodiment of the present invention. In the following explanations, the injection strength, $\xi_i$, indicates the power of an optical injection signal relative to that of the microwave generation laser 203, and the detuning frequency, $f_i$, indicates the frequency of the optical injection signal relative to the free-running frequency of the microwave generation laser 203. The optical injection signal can be a continuous-wave optical signal or a comb-like optical signal. The microwave generation laser 203 may be a semiconductor laser, which can be a Fabry Perot laser, a distributed feedback laser, a vertical cavity surface emitting laser, a quantum-well laser, a quantum-dash laser, or a quantum-dot laser.

When subject to optical injection under proper conditions of $\xi_i$ and $f_i$, the microwave generation laser 203 can be operated in the period-one nonlinear dynamics. While the optical injection regenerates, oscillation sidebands that are equally separated from the regeneration by an oscillation frequency, $f_0$, sharply emerge. Attributed to the cavity resonance red-shift induced by the optical injection, the lower-frequency oscillation sideband has a power that is not only much higher than the upper-frequency oscillation sideband but is also close to the regeneration. Since the oscillation frequency, $f_0$, can be tuned within the microwave band (between 0.3 and 300 GHz) by simply adjusting $\xi_i$ and $f_i$, sending the output optical signal of the microwave generation laser 203 operated under the period-one nonlinear dynamics into a photodetector generates a microwave signal at $f_0$. Under a fixed output power of the microwave generation laser 203, the power level of the generated microwave signal depends on the power ratio between the lower-frequency oscillation sideband and the regeneration, which is defined as the sideband-to-carrier ratio (SCR) and is used as a quantitative indicator in the following explanations. The photonic microwave generation apparatus and method of the present invention apply the above-mentioned characteristics to generate microwave signals photonically. For example, FIG. 4 shows an optical spectrum of a period-one nonlinear dynamical state when the microwave generation laser 203 is subject to continuous-wave optical injection under $\xi_i$=1.06 and $f_i$=30 GHz. In addition to the regeneration at the offset frequency of 30 GHz, two oscillation sidebands emerge at the offset frequency of −10 GHz and 70 GHz. The oscillation frequency $f_0$ of the period-one nonlinear dynamics state is therefore 40 GHz, suggesting that a microwave signal at 40 GHz can be generated after photodetection of the period-one nonlinear dynamical state. Since both $f_0$ and SCR can be adjusted by simply changing $\xi_i$ and $f_i$, the photonic microwave generation apparatus of the present invention can generate a microwave signal of different frequency and different power according to a different operating requirement.

For the present invention, instead of using a continuous-wave optical signal to excite the period-one nonlinear dynamics of the microwave generation laser 203, a comb-like optical signal generated by the comb-like optical signal generation module 10 is used. FIG. 5 shows an optical spectrum of such a comb-like optical signal. The comb-like optical signal may be an optical signal of multiple harmonics with highly correlated phases. The power of the harmonics decreases as the harmonic order N increases. The frequency separation, $f_m$, between adjacent harmonics is a subharmonic of the oscillation frequency $f_0$ of the period-one nonlinear dynamics excited in the microwave generation laser 203.

As an example, the comb-like optical signal generation module 10 may include an optical injection laser 101, an optical polarization controller 102, a microwave reference generator 103, a microwave amplifier 104, and an external modulator 105. The optical injection laser 101, which can be a tunable laser, generates a continuous-wave optical signal of a specific frequency and specific power according to the operating requirement. To change the power of the continuous-wave optical signal, an optical power adjuster (not shown in FIG. 1) that is externally attached to or internally built inside the optical injection laser 101 can also be used. The optical polarization controller 102 receives the continuous-wave optical signal, adjusts the polarization of the continuous-wave optical signal, and then outputs the continuous-wave optical signal.

In addition, the microwave reference generator 103 generates a microwave reference at a frequency of $f_m$ which is a subharmonic of the oscillation frequency $f_0$. For the example shown in FIG. 5, $f_m$ is chosen to be 4 GHz which is the tenth subharmonic of $f_0$=40 GHz. The choice of $f_m$ can also be 1, 2, 5, 8, or 10 GHz, or any other value that can be used for the photonic microwave generation apparatus 1 of the present invention. The microwave amplifier 104, connected to the microwave reference generator 103, receives the microwave reference and generates a comb-like microwave signal using the nonlinearity of the microwave amplifier 104. The comb-like microwave signal is a microwave signal of multiple harmonics with highly correlated phases at a fundamental frequency equal to $f_m$. The nonlinearity of the microwave amplifier 104 is induced by operating the microwave amplifier 104 at the saturation regime.

The external modulator 105 receives the continuous-wave optical signal and the comb-like microwave signal, and superimposes the comb-like microwave signal on the continuous-wave optical signal to generate the comb-like optical signal described above. On either frequency side around the optical carrier of the comb-like optical signal, many highly phase-correlated harmonics appear, which are separated from the optical carrier by integral multiples of the microwave reference frequency $f_m$. The external modulator 105 can be a phase modulator.

In addition to the microwave generation laser 203, the photonic microwave generation module 20 may also include an optical power adjuster 201 and an optical polarization controller 202. The optical power adjuster 201 receives and adjusts the power of the comb-like optical signal generated by the comb-like optical signal generation module 10 in order to change the injection strength $\xi_i$. Varying the frequency of the continuous-wave optical signal generated by the optical injection laser 101 or the frequency of the output optical signal generated by the microwave generation laser 203 changes the detuning frequency $f_i$. The frequency separation between the frequency components (i.e., the oscillation frequency $f_0$) or the power of each frequency component of the period-one nonlinear dynamics can be changed by adjusting either $\xi_i$ or $f_i$. Different characteristics of the period-one nonlinear dynamics can therefore be achieved by the microwave generation laser 203. The optical power adjuster 201 may comprise an active optical device and/or a passive optical device to adjust the power of the comb-like optical signal. The active optical device may be an optical power amplifier and the passive optical device may be an optical power attenuator. If the power of the comb-like optical signal generated by the comb-like optical signal generation module is adequately high, the optical power adjuster 201 only needs an optical power attenuator to achieve the power adjustment.

The optical polarization controller 202, attached to the optical power adjuster 201, receives the comb-like optical signal after power adjustment by the optical power adjuster 201 and adjusts the polarization of the comb-like optical signal so that the polarization of the comb-like optical signal is aligned with that of the microwave generation laser 203 in order to maximize the optical injection efficiency. After the polarization adjustment, the comb-like optical signal is sent toward the microwave generation laser 203.

The photonic microwave generation module 20 may also include an optical path controller 204, disposed at an input end of the microwave generation laser 203, unidirectionally directing the comb-like optical signal toward the microwave generation laser 203, and unidirectionally directing the output optical signal of the microwave generation laser 203 toward an output port of the photonic microwave generation apparatus. In this manner, not only the comb-like optical signal can be efficiently directed, but also optical back-reflections can be suppressed. The optical path controller 204 can be an optical circulator. The output optical signal of the photonic microwave generation module 20 can be split into two beams by an optical coupler (not shown in FIG. 1). The two beams are sent into an optical spectrum analyzer 301 and a photodetector 302 followed by a microwave spectrum analyzer 303, respectively, to analyze the optical and microwave spectra of the output optical signal. Based on the analysis of the microwave spectrum, the linewidth of the generated microwave signal can be smaller than 1 Hz, while the frequency of the generated microwave signal can be kept the same for a long period of time, such as more than 30 minutes.

Under the same $\xi_i=1.06$ and $f_i=30$ GHz considered in FIG. 4, for example, FIG. 6 presents the optical spectrum of the output optical signal when the microwave generation laser 203 is subject to the comb-like optical signal at $f_m=4$ GHz shown in FIG. 5. Except the tightly spaced side peaks resulting from the regeneration of the harmonic comb, a period-one dynamical state with key features that is closely similar to the one invoked by the continuous-wave optical signal shown in FIG. 4 is excited. At the same time, the tenth harmonic of the lower-frequency harmonic comb, which appears at or close to the lower-frequency oscillation sideband of the period-one nonlinear dynamical state, phase-locks the lower oscillation sideband of the period-one nonlinear dynamical state. As a result, the photonic microwave generation apparatus 1 of the present invention generates an output optical signal carrying a microwave signal with a linewidth of below 1 Hz and a frequency stabilized at 40 GHz. FIG. 7 shows the microwave spectrum of such a microwave signal, where the x-axis is centered at 40 GHz.

Figure 8:
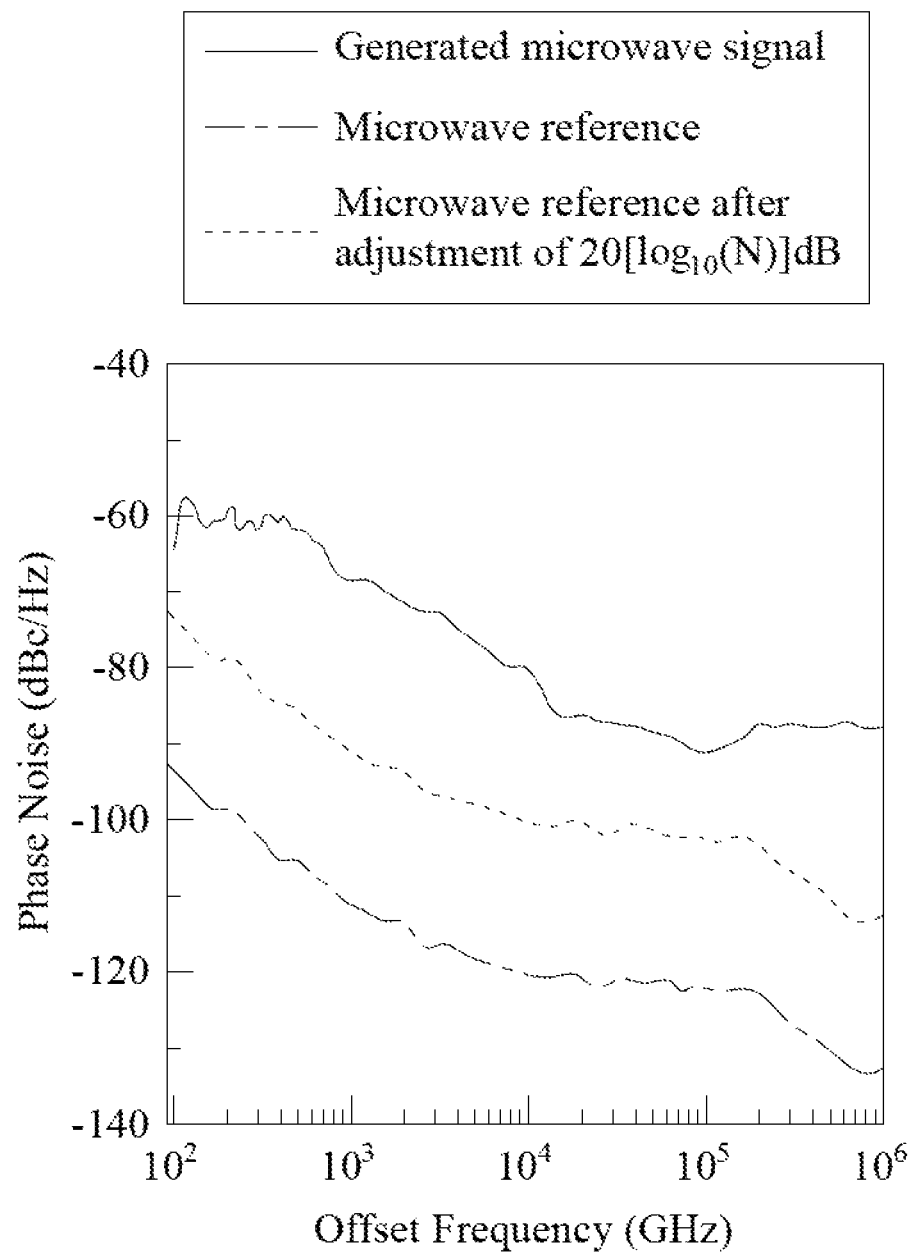
FIG. 8 shows phase noise in terms of microwave offset frequency for a generated microwave signal at 40 GHz, a microwave reference at 4 GHz, and the microwave reference at 4 GHz scaled by $20[\log_{10}(N)]$ dB, respectively, according to the preferred embodiment of the present invention.

To demonstrate the stability of microwave signals generated by the photonic microwave generation apparatus 1 of the present invention, the single-sideband phase noise of the microwave signals is analyzed. Referring to FIG. 8, FIG. 8 shows phase noise in terms of microwave offset frequency for the generated microwave signal at 40 GHz shown in FIG. 7, the microwave reference at 4 GHz used in FIG. 7, and the microwave reference at 4 GHz used in FIG. 7 scaled by $20[\log_{10}(N)]$ dB, respectively, according to the preferred embodiment of the present invention. Note that, since the phase noise scales with the square of the frequency multiplication, or the harmonic order N in the present demonstration, the phase noise of the microwave reference at 4 GHz scaled up by $20[\log_{10}(N)]=20$ dB for $N=10$ in this demonstration is shown for fair comparison.

As discussed above, both $f_0$ and SCR of the period-one nonlinear dynamics can be adjusted by simply changing $\xi_i$ and $f_i$ to generate a microwave signal of different frequency or power. Accordingly, by properly adjusting $\xi_i$ and $f_i$, a period-one nonlinear dynamical state of different $f_0$ but the same SCR can be induced and therefore a microwave signal of a different frequency but the same power can be generated. By taking advantage of this feature, at the same microwave reference frequency $f_m$, the lower-frequency oscillation sideband of a period-one nonlinear dynamical state of different $f_0$ can be phased-locked by a harmonic of a different order of the same comb-like optical signal. This results in the generation of a narrow-linewidth microwave signal of a different frequency but the same power. On the other hand, using a different microwave reference frequency $f_m$, the lower-frequency oscillation sideband of a period-one nonlinear dynamical state of different $f_0$ can be phased-locked by a harmonic of the same order of a different comb-like optical signal. This also results in the generation of a narrow-linewidth microwave signal of a different frequency but the same power.

As an example, a period-one nonlinear dynamical state of $f_0=20$ GHz is excited at $(\xi_i, f_i)=(0.95, 3$ GHz$)$. The lower-frequency oscillation sideband of the period-one dynamical state can be phase-locked by a harmonic of $N=5$ if a comb-like optical signal of $f_m=4$ GHz is used. A microwave signal at 20 GHz with a linewidth of below 1 Hz is therefore generated. Similarly, period-one nonlinear dynamical states of $f_0=24, 28, 30, 36,$ and $40$ GHz can be excited at different $(\xi_i, f_i)$, and their lower-frequency oscillation sidebands can be phase-locked by harmonics of $N=6$ to 10, respectively, if the same comb-like optical signal of $f_m=4$ GHz is used. Consequently, microwave signals at 24, 28, 32, 36, and 40 GHz with a linewidth of below 1 Hz are generated.

Figure 9:
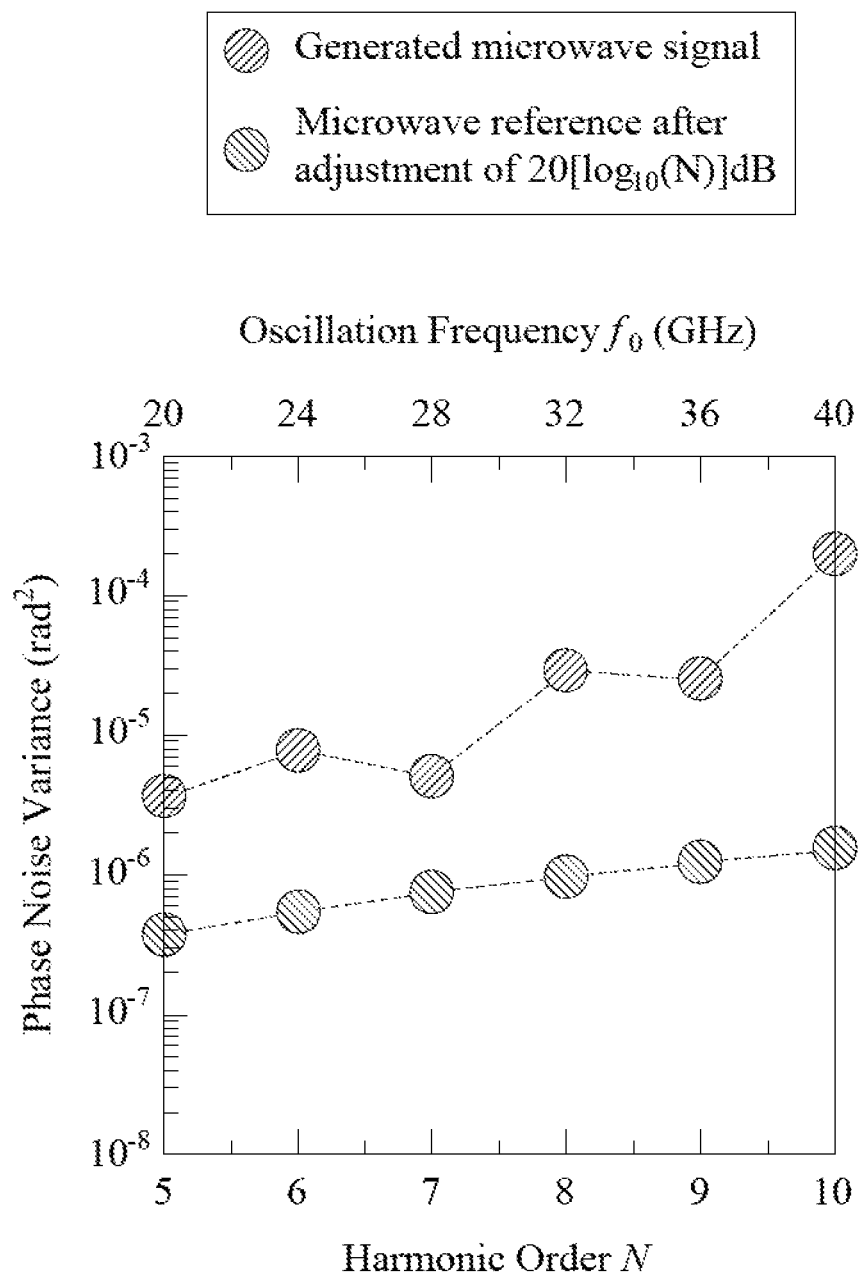
FIG. 9 shows phase noise variance in terms of harmonic order N for generated microwave signals and microwave references scaled by $20[\log_{10}(N)]$ dB when the microwave reference frequency $f_m$=4 GHz according to the preferred embodiment of the present invention.
Figure 10:
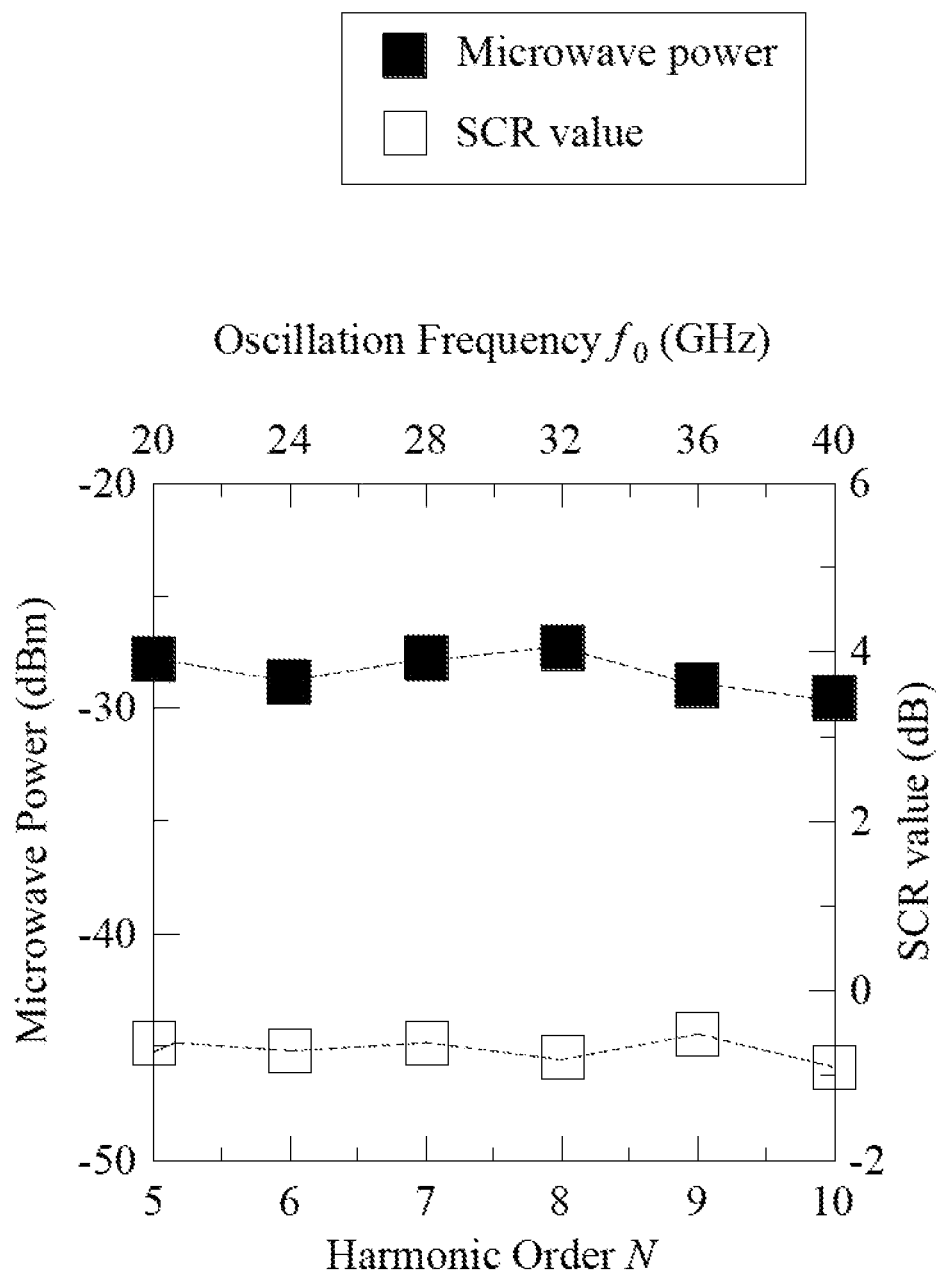
FIG. 10 shows power of the generated microwave signals and sideband-to-carrier ratio (SCR) of the output optical signals in terms of harmonic order N when the microwave reference frequency $f_m$=4 GHz according to the preferred embodiment of the present invention.

To demonstrate the quality of the microwave signals discussed above, the phase noise variance of each microwave signal is estimated by integrating the phase noise of each microwave signal from the microwave frequency offset of 100 Hz to 1 MHz, and is compared with that of the 4-GHz microwave reference, scaled up by $20[\log_{10}(N)]$ dB for each different N, used to achieve the phase locking. Referring to FIG. 9, FIG. 9 shows phase noise variance in terms of harmonic order N for generated microwave signals and microwave references scaled by $20[\log_{10}(N)]$ dB when the microwave reference frequency $f_m=4$ GHz according to the preferred embodiment of the present invention. For ease of comparison, both N and the corresponding $f_0$, the frequency of each generated microwave signal, are marked in the lower and upper x-axes, respectively. As shown in FIG. 9, compared with the phase noise variance of the microwave reference scaled by $20[\log_{10}(N)]$ dB for each different N, each microwave signal of a different frequency generated by the photonic microwave generation apparatus 1 of the present invention exhibits high frequency stability and low phase noise. Besides, referring to FIG. 10, which shows power of the generated microwave signals and sideband-to-carrier ratio (SCR) of the output optical signals in terms of harmonic order N when the microwave reference frequency $f_m=4$ GHz according to the preferred embodiment of the present invention. For ease of comparison, both N and the corresponding $f_0$, the frequency of each generated microwave signal, are marked in the lower and upper x-axes, respectively. As shown in FIG. 10, the period-one nonlinear dynamical states of different $f_0$ shown in FIG. 9 are so chosen that the SCR values are about the same, leading to the generation of microwave signals of different frequencies but the same power. Hence, this example demonstrates that, by adopting the same microwave reference frequency, using a harmonic of a different order in a comb-like optical signal to phase-lock the lower-frequency oscillation sideband of a period-one nonlinear dynamical state of different $f_0$ can generate a microwave signal of a different frequency but the same power while achieving a microwave linewidth of less than 1 Hz, a phase noise of low level, and a frequency of high stability.

As another example, a period-one nonlinear dynamical state of $f_0=20$ GHz is excited at $(\xi_i, f_i)=(0.78, 4$ GHz$)$. The lower-frequency oscillation sideband of the period-one nonlinear dynamical state can be phase-locked by a harmonic of $N=10$ if a comb-like optical signal of $f_m=2$ GHz is used. A microwave signal at 20 GHz with a linewidth of below 1 Hz is therefore generated. Similarly, period-one nonlinear dynamical states of $f_0=25$, 30, 35, and 40 GHz can be excited at different $(\xi_i, f_i)$, and their lower-frequency oscillation sidebands can be phase-locked by harmonics of the same order $N=5$ if comb-like optical signals of $f_m=2.5$, 3, 3.5, and 4 GHz are used, respectively. Consequently, microwave signals at 25, 30, 35, and 40 GHz with a linewidth of below 1 Hz are generated.

Figure 11:
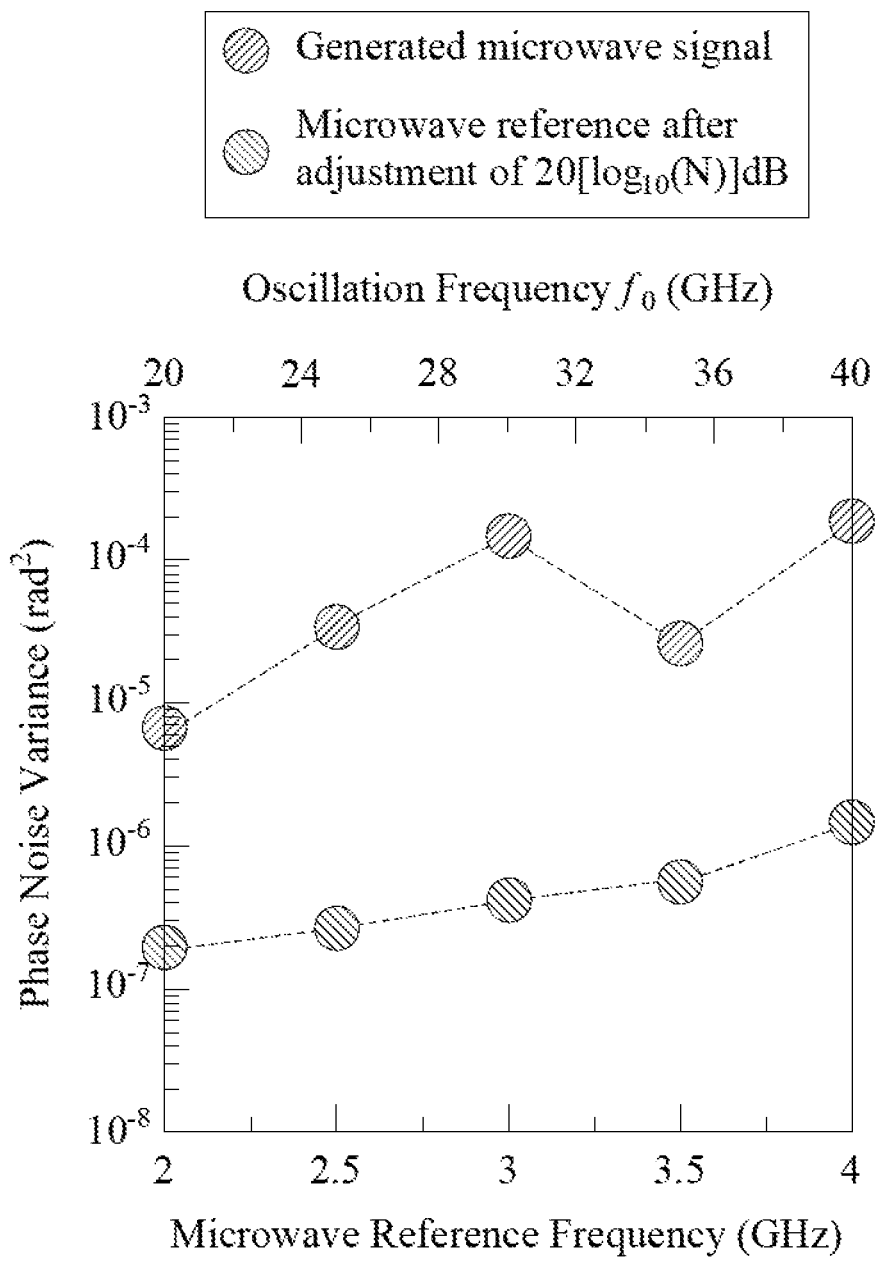
FIG. 11 shows phase noise variance in terms of microwave reference frequency $f_m$ for generated microwave signals and microwave references scaled by $20[\log_{10}(N)]$ dB when the harmonic order N=10 according to the preferred embodiment of the present invention.
Figure 12:
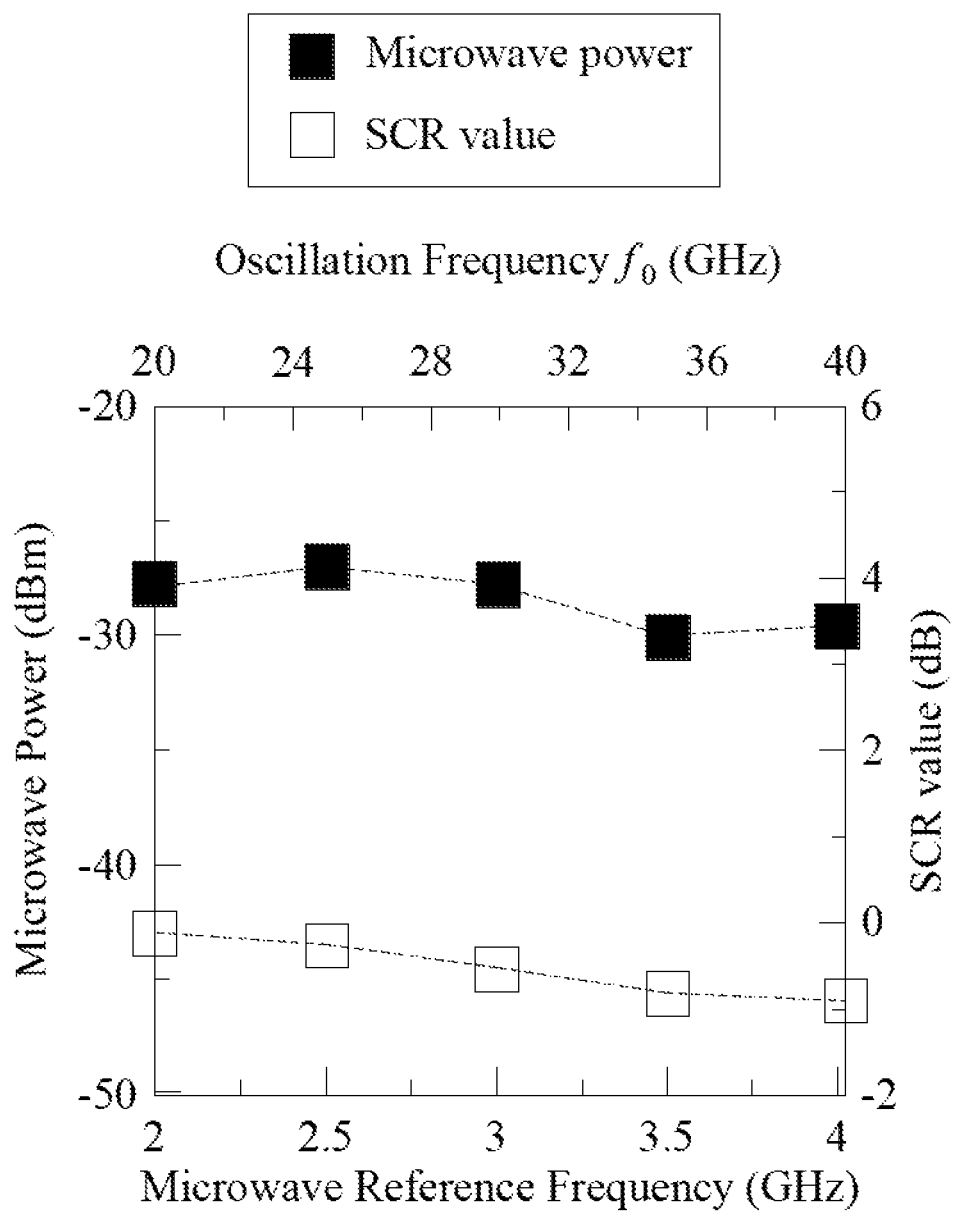
FIG. 12 shows power of the generated microwave signals and sideband-to-carrier ratio (SCR) of the output optical signals in terms of microwave reference frequency $f_m$ when the harmonic order N=10 according to the preferred embodiment of the present invention.

To demonstrate the quality of the microwave signals discussed above, the phase noise variance of each microwave signal is again estimated by integrating the phase noise of each microwave signal from the microwave frequency offset of 100 Hz to 1 MHz, and is compared with that of each corresponding microwave reference, scaled up by $20[\log_{10}(N)]$ dB for $N=10$, used to achieve the phase locking. Referring to FIG. 11, which shows phase noise variance in terms of microwave reference frequency $f_m$ for generated microwave signals and microwave references scaled by $20[\log_{10}(N)]$ dB when $N=10$ according to the preferred embodiment of the present invention. For ease of comparison, both $f_m$ and the corresponding $f_0$, the frequency of each generated microwave signal, are marked in the lower and upper x-axes, respectively. As shown in FIG. 11, compared with the phase noise variance of the microwave reference scaled by $20[\log_{10}(N)]$ dB for each different $f_m$, each microwave signal of a different frequency generated by the photonic microwave generation apparatus 1 of the present invention exhibits high frequency stability and low phase noise. Besides, referring to FIG. 12, which shows power of the generated microwave signals and sideband-to-carrier ratio (SCR) of the output optical signals in terms of microwave reference frequency $f_m$ when $N=10$ according to the preferred embodiment of the present invention. For ease of comparison, both $f_m$ and the corresponding $f_0$, the frequency of each generated microwave signal, are marked in the lower and upper x-axes, respectively. As shown in FIG. 12, the period-one nonlinear dynamical states of different $f_0$ shown in FIG. 11 are so chosen that the SCR values are about the same, leading to the generation of microwave signals of different frequencies but the same power. Hence, this example demonstrates that, by adopting a different microwave reference frequency, using a harmonic of the same order in a different comb-like optical signal to phase-lock the lower-frequency oscillation sideband of a period-one nonlinear dynamical state of different $f_0$ can generate a microwave signal of a different frequency but the same power while achieving a microwave linewidth of less than 1 Hz, a phase noise of low level, and a frequency of high stability.

To briefly summarize, by adjusting the injection strength $\xi_i$, and the detuning frequency $f_i$, the present invention can generate a period-one nonlinear dynamical state of different $f_0$ but the same SCR. Meanwhile, by adopting the same microwave reference frequency, a harmonic of a different order in a comb-like optical signal can be used to phase-lock the lower-frequency oscillation sideband of a period-one nonlinear dynamical state of different $f_0$. On the other hand, by adopting a different microwave reference frequency, a harmonic of the same order in a different comb-like optical signal can be used to phase-lock the lower-frequency oscillation sideband of a period-one nonlinear dynamical state of different $f_0$. Hence, no matter which phase-locking approach of the above is adopted, the photonic microwave generation apparatus 1 of the present invention can generate a broadly frequency-tunable microwave signal of a narrow linewidth (for example, a linewidth of less than 1 Hz), a stable frequency (for example, the frequency is fixed within a time period of 30 minutes), low phase noise, and constant power.

Even though the above explanations also describe the photonic microwave generation method of the present invention, more explanations are provided as follows for further clarifications. Wherein, the details described above can be the reference in the photonic microwave generation method of the present invention.

Figure 3:
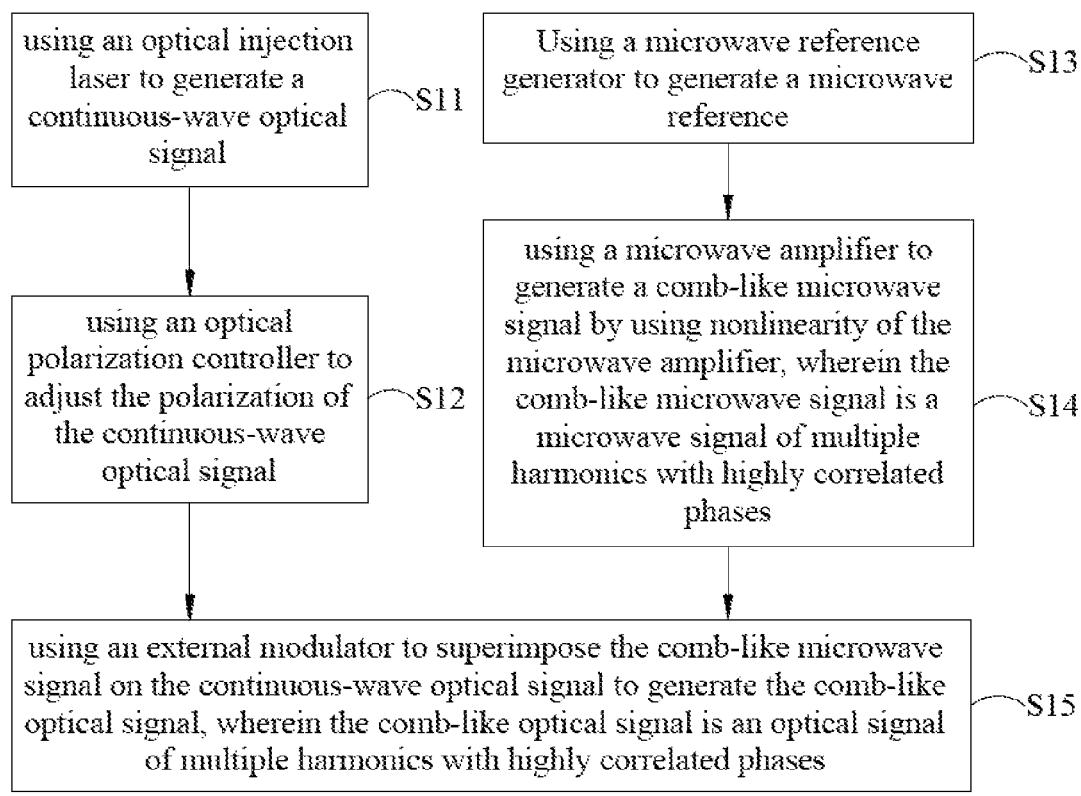
FIG. 3 is a second flow diagram showing the photonic microwave generation method according to the preferred embodiment of the present invention.

Referring to FIG. 1 to FIG. 5, FIG. 2 is a first flow diagram showing a photonic microwave generation method according to a preferred embodiment of the present invention, and FIG. 3 is a second flow diagram showing the photonic microwave generation method according to the preferred embodiment of the present invention. As shown in FIG. 1 to FIG. 5, the photonic microwave generation method of the present invention uses a comb-like optical signal generation module 10 to generate a comb-like optical signal (Step S10), and then sends the comb-like optical signal generated by the comb-like optical signal generation module 10 into a photonic microwave generation module 20 comprising a microwave generation laser 203. The optical power and carrier frequency of the comb-like optical signal are adjusted so as to place the microwave generation laser in period-one nonlinear dynamics and, at the same time, a harmonic of the comb-like optical signal phase-locks one oscillation sideband of the period-one nonlinear dynamics. As a result, an output optical signal carrying a microwave signal of a narrow linewidth (for example, a linewidth of less than 1 Hz) and a stable frequency (for example, the frequency is fixed within a time period of 30 minutes) is generated by the microwave generation laser 203 (Step S24).

Step S10 can further comprise the following steps:

Step S11: using an optical injection laser 101 to generate a continuous-wave optical signal;

Step S13: using a microwave reference generator 103 to generate a microwave reference;

Step S14: using a microwave amplifier 104 to receive the microwave reference from the microwave reference generator 103 and to generate a comb-like microwave signal by using the nonlinearity of the microwave amplifier after Step S13, wherein the comb-like microwave signal is a microwave signal of multiple harmonics with highly correlated phases; and Step S15: using an external modulator 105 to receives the comb-like microwave signal from the microwave amplifier 104 and the continuous-wave optical signal from the optical injection laser 101, and then using the external modulator 105 to superimpose the comb-like microwave signal on the continuous-wave optical signal to generate the comb-like optical signal, wherein the comb-like optical signal is an optical signal of multiple harmonics with highly correlated phases.

In addition, between Step S11 and Step S15, the continuous-wave optical signal from the optical injection laser 101 can be sent into an optical polarization controller 102 to adjust the polarization of the continuous-wave optical signal. After the polarization adjustment, the continuous-wave optical signal is sent toward an external modulator 105 (Step S12).

Between Step S10 and Step S24, an optical power adjuster 201 can be used to adjust the optical power of the comb-like optical signal generated by the comb-like optical signal generation module 10 (Step S21). In addition, an optical polarization controller 202 can be used to adjust the polarization of the comb-like optical signal after the power adjustment (Step S22).

Moreover, between Step S10 and Step S24, an optical path controller 204 can be used to unidirectionally direct the comb-like optical signal toward the microwave generation laser 203 (Step 23). Following Step S24, the same optical path controller 204 can be used to unidirectionally direct the output optical signal of the microwave generation laser 203 toward an output port of the photonic microwave generation apparatus (Step 25).

Based on the above explanations and descriptions, the photonic microwave generation apparatus and method of the present invention use a semiconductor laser as the microwave generation laser 203. Without any external perturbation, the typical output of a semiconductor laser is a continuous wave of one single frequency. Under proper conditions of the injection strength and detuning frequency, injecting a continuous-wave optical signal generated by the optical injection laser 101 into the microwave generation laser 203 induces the period-one nonlinear dynamics, showing completely different physical behaviors and characteristics. The photonic microwave generation apparatus and method of the present invention can generate a broadly frequency-tunable microwave signal of a narrow linewidth (for example, a linewidth of less than 1 Hz), a stable frequency (for example, the frequency is fixed within a time period of 30 minutes), low phase noise, and constant power.

It should be understood that the present invention is not limited to the details thereof. Various equivalent variations and modifications may still occur to those skilled in this art in view of the teachings of the present invention. Thus, all such variations and equivalent modifications are also embraced within the scope of the present invention as defined in the appended claims.

What is claimed is:

1. A photonic microwave generation apparatus, comprising:
   a comb-like optical signal generation module, generating a comb-like optical signal of multiple harmonics; and
   a photonic microwave generation module, receiving the comb-like optical signal injected from the comb-like optical signal generation module and comprising a microwave generation laser to generate an output optical signal carrying a microwave signal, wherein the microwave signal possesses a linewidth less than 1 Hz and a frequency fixed within a time period of 30 minutes, wherein an optical power and a carrier frequency of the comb-like optical signal are adjusted so as to place the microwave generation laser in period-one nonlinear dynamics of multiple oscillation sidebands, and wherein one harmonic of the comb-like optical signal phase-locks one oscillation sideband of the period-one nonlinear dynamics.

2. The photonic microwave generation apparatus of claim 1, wherein the comb-like optical signal generation module comprises:
   an optical injection laser, generating a continuous-wave optical signal;
   an optical polarization controller, adjusting the polarization of the continuous-wave optical signal;
   a microwave reference generator, generating a microwave reference;
   a microwave amplifier, receiving the microwave reference and generating a comb-like microwave signal by using nonlinearity of the microwave amplifier, wherein the comb-like microwave signal is a microwave signal of multiple phase-correlated harmonics; and
   an external modulator, superimposing the comb-like microwave signal on the continuous-wave optical signal to generate the comb-like optical signal, wherein the comb-like optical signal is an optical signal of multiple phase-correlated harmonics.

3. The photonic microwave generation apparatus of claim 1, wherein the photonic microwave generation module further comprises:
   an optical power adjuster, adjusting the optical power of the comb-like optical signal; and
   an optical polarization controller, adjusting the polarization of the comb-like optical signal and outputting the comb-like optical signal to the microwave generation laser.

4. The photonic microwave generation apparatus of claim 3, wherein the optical power adjuster further comprises an active optical device or a passive optical device.

5. The photonic microwave generation apparatus of claim 4, wherein the active optical device is an optical power amplifier and the passive optical device is an optical power attenuator.

6. The photonic microwave generation apparatus of claim 1, wherein the photonic microwave generation module further comprises an optical path controller, disposed at an input end of the microwave generation laser, unidirectionally directing the comb-like optical signal toward the microwave generation laser, and unidirectionally directing the output optical signal of the microwave generation laser toward an output port of the photonic microwave generation apparatus.

7. The photonic microwave generation apparatus of claim 6, wherein the optical path controller is an optical circulator and the microwave generation laser is a semiconductor laser.

8. A photonic microwave generation method, comprising steps of:
  using a comb-like optical signal generation module to generate a comb-like optical signal of multiple harmonics; and
  using a photonic microwave generation module comprising a microwave generation laser to receive the comb-like optical signal injected from the comb-like optical signal generation module and to generate an output optical signal carrying a microwave signal, wherein the microwave signal possesses a linewidth less than 1 Hz and a frequency fixed within a time period of 30 minutes, wherein an optical power and a carrier frequency of the comb-like optical signal are adjusted so as to place the microwave generation laser in period-one nonlinear dynamics of multiple oscillation sidebands, and wherein one harmonic of the comb-like optical signal phase-locks one oscillation sideband of the period-one nonlinear dynamics.

9. The photonic microwave generation method of claim 8, wherein the using the comb-like optical signal generation module to generate the comb-like optical signal comprises steps of:
  using an optical injection laser to generate a continuous-wave optical signal;
  using an optical polarization controller to adjust the polarization of the continuous-wave optical signal;
  using a microwave reference generator to generate a microwave reference;
  using a microwave amplifier to receive the microwave reference and to generate a comb-like microwave signal by using nonlinearity of the microwave amplifier, wherein the comb-like microwave signal is a microwave signal of multiple phase-correlated harmonics; and
  using an external modulator to superimpose the comb-like microwave signal on the continuous-wave optical signal to generate the comb-like optical signal, wherein the comb-like optical signal is an optical signal of multiple phase-correlated harmonics.

10. The photonic microwave generation method of claim 9, further comprising steps between the using the comb-like optical signal generation module to generate the comb-like optical signal and the using the photonic microwave generation module to receive the comb-like optical signal and to generate the output optical signal of:
  using an optical power adjuster to adjust the optical power of the comb-like optical signal; and
  using an optical polarization controller to adjust the polarization of the comb-like optical signal and output the comb-like optical signal to the microwave generation laser.

11. The photonic microwave generation method of claim 8, wherein the using the photonic microwave generation module to receive the comb-like optical signal and to generate the output optical signal further comprises:
  using an optical path controller to unidirectionally direct the comb-like optical signal toward the microwave generation laser, and to unidirectionally direct the output optical signal of the microwave generation laser toward an output port of the photonic microwave generation apparatus.

* * * * *